(U)nited States Patent [19]

Matsumoto

[11] Patent Number: 4,984,061
[45] Date of Patent: Jan. 8, 1991

[54] SEMICONDUCTOR DEVICE IN WHICH WIRING LAYER IS FORMED BELOW BONDING PAD

[75] Inventor: Hiroshi Matsumoto, Hyogo, Japan
[73] Assignee: Kabushiki Kaisha Toshiba, Kawasaki, Japan
[21] Appl. No.: 192,665
[22] Filed: May 10, 1988
[30] Foreign Application Priority Data May 15, 1987 [JP] Japan ................ 62-116727

[51] Int. Cl.$^5$ ............ H01L 23/48; H01L 21/88; H01L 23/14
[52] U.S. Cl. ......................... 357/68; 357/71
[58] Field of Search ........... 357/71, 71 R, 36, 68, 357/71 S

[56] References Cited
U.S. PATENT DOCUMENTS

| 4,525,383 | 6/1985 | Saito | 357/71 |
| 4,543,592 | 9/1985 | Itsumi et al. | 357/71 |
| 4,582,563 | 4/1986 | Hazuki et al. | 357/71 R |
| 4,617,193 | 6/1986 | Wu | 357/71 |
| 4,636,832 | 1/1987 | Abe et al. | 357/68 |
| 4,656,496 | 4/1987 | Widlar | 357/36 |
| 4,795,722 | 1/1989 | Welch et al. | 357/71 |

FOREIGN PATENT DOCUMENTS

| 0100100 | 2/1984 | European Pat. Off. | |
| 47476 | 4/1979 | Japan . | |
| 0079746 | 5/1985 | Japan | 357/71 |
| 45048 | 11/1985 | Japan . | |
| 0239656 | 10/1986 | Japan | 357/71 |
| 293930 | 11/1988 | Japan . | |
| 2181894 | 4/1987 | United Kingdom . | |

OTHER PUBLICATIONS

K. Mukai et al., "A New Integration Technology that Enables Forming Bonding Pads on Active Areas", IEDM International Electron Devices Meeting, Dec. 7-9, 1981, pp. 62-65.

Primary Examiner—Andrew J. James
Assistant Examiner—Viet Q. Nguyen
Attorney, Agent, or Firm—Finnegan, Henderson, Farabow, Garrett, and Dunner

[57] ABSTRACT

In a semiconductor device wherein a bonding pad is formed on an electrode through an insulating interlayer and a bonding wire is bonded to the bonding pad by thermocompression bonding, a through hole for connecting the bonding pad and the electrode is formed in the insulating interlayer above a contact hole for connecting the electrode and an active region formed in a semiconductor substrate. Metal columns of members of the electrode filled in the contact hole and members of the bonding pad filled in the through hole are formed under the bonding pad.

15 Claims, 1 Drawing Sheet

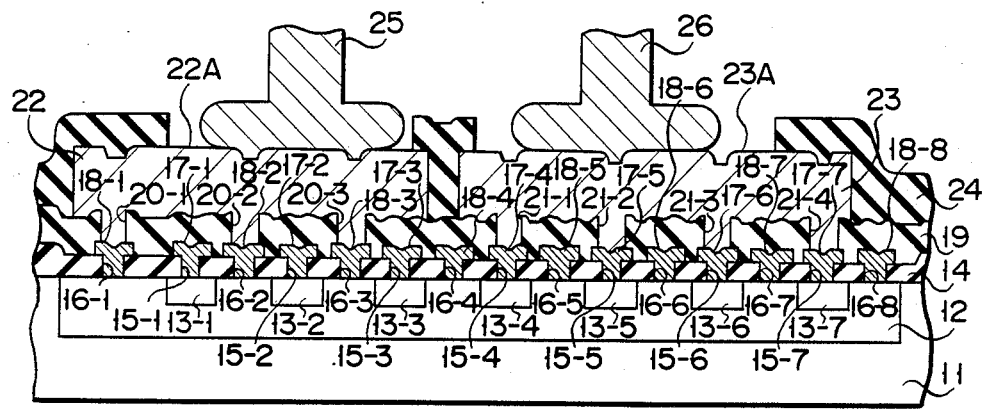
F I G. 1
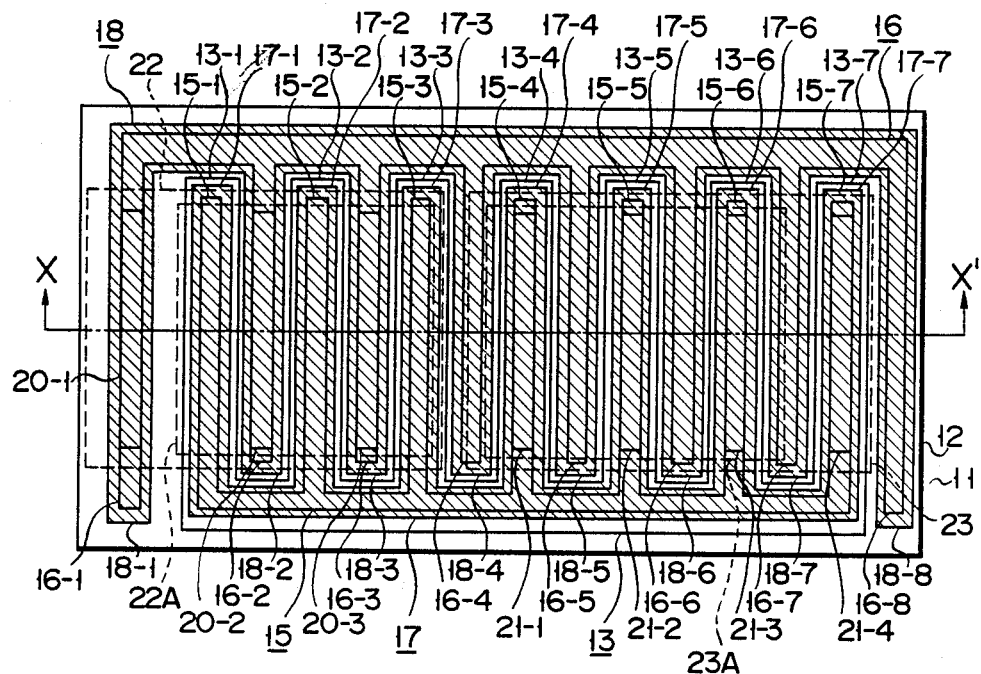
F I G. 2

SEMICONDUCTOR DEVICE IN WHICH WIRING LAYER IS FORMED BELOW BONDING PAD

BACKGROUND OF THE INVENTION

1. Field of the Invention

The present invention relates to a semiconductor device in which a second wiring metal layer is formed on a first metal wiring layer through an insulating interlayer and wire bonding is performed for the second metal wiring layer and, more particularly, to prevention of cracking of the insulating interlayer formed immediately below a bonding region.

2. Description of the Related Art

In a conventional bipolar transistor, an emitter region is formed in a comb-like shape in order to reduce an output capacitance, improve high-frequency characteristics, and satisfy a need for increasing an output capacity. The emitter region is formed in a surface part of a base region. The base region is formed in a major surface region of a semiconductor substrate which serves as a collector region. A comb-like emitter electrode is formed on the emitter region so as to correspond to the emitter region. A comb-like base electrode is formed on the base region. The emitter and base electrodes are formed such that teeth of the electrodes are arranged in an interdigital manner at predetermined intervals.

In order to effectively utilize an active region of a transistor, a multilayered structure is utilized in which bonding pads are formed on the emitter and base electrodes through an insulating interlayer. In this case, base and emitter bonding pads are used. The base bonding pad is connected to part of the base electrode through a contact hole formed in the insulating interlayer. The emitter bonding pad is connected to part of the emitter electrode through another contact hole formed in the insulating interlayer. Base and emitter deriving bonding wires are respectively bonded to the bonding pads by thermocompression bonding.

With the above arrangement, the active region can be effectively utilized, and resistances from the emitter and base regions to the corresponding bonding wires can be reduced. In addition, the dynamic characteristics of the transistor can also be improved.

With the above arrangement, however, mechanical stress acts on the insulating interlayer by a pressure during bonding of base and emitter deriving bonding wires. The insulating interlayer is formed on the interdigital base and emitter electrodes, i.e., a portion having a large three-dimensional pattern. Therefore, a three-dimensional portion is formed on the surface of the insulating interlayer accordingly. A bonding pressure tends to be concentrated on a step of the three-dimensional pattern on the surface of the insulating interlayer. For this reason, a crack tends to occur in the insulating interlayer. In the worst case, the insulating interlayer is destroyed. Such a crack cannot be easily found by an initial electrical function test. Therefore, reliability of the semiconductor device is undesirably degraded.

SUMMARY OF THE INVENTION

It is, therefore, an object of the present invention to provide a semiconductor device wherein cracking of an insulating interlayer formed immediately under a bonding region can be suppressed, and reliability of the semiconductor device can be improved.

According to an embodiment of the present invention, there is provided a semiconductor device comprising: a semiconductor substrate; an active region formed in a region of a major surface of the semiconductor substrate; a first insulating layer formed on the major surface of the semiconductor substrate which includes the active region; a first contact hole formed at a position in the first insulating layer corresponding to the active region; a first conductive layer formed in the first contact hole and a portion of the first insulating layer around the contact hole; a second insulating layer formed on the first conductive layer and the first insulating layer; a second contact hole formed at a position in the second insulating layer corresponding to the first conductive layer and located above the first contact hole; a second conductive layer formed on the second insulating layer and filled in the second contact hole; and a bonding wire connected to the second conductive layer in regions located above the first and second contact holes.

With the above structure, the pressure applied to the second insulating layer during wire bonding can be supported by columnar portions of the first and second conductive layers filled in the first and second contact holes. Therefore, the pressure acting on the second insulating layer can be reduced to suppress occurrence of cracks, thereby providing a highly reliable semiconductor device.

BRIEF DESCRIPTION OF THE DRAWINGS

FIG. 1 is a sectional view of a semiconductor device according to an embodiment of the present invention; and FIG. 2 is a plan view showing a pattern of the semiconductor device shown in FIG. 1.

DETAILED DESCRIPTION OF THE PREFERRED EMBODIMENT

FIG. 1 is a sectional view of a semiconductor device according to an embodiment of the present invention. FIG. 2 is a plan view showing a pattern of the semiconductor device shown in FIG. 1, when taken along the line X–X' of FIG. 1. FIGS. 1 and 2 exemplify an npn bipolar transistor as a semiconductor device having a wiring layer under the bonding pad. N-type semiconductor substrate (silicon substrate) 11 serves as a collector region. P-type base region 12 is formed in the major surface region of semiconductor substrate 13. N-type emitter region 13 is formed in a surface region of base region 12. Emitter region 13 has comb-like teeth 13-1 to 13-7. 3,000-Å thick first insulating layer 14 is formed on the major surface of semiconductor substrate 11. Contact hole 15 is formed by photoetching at a position in first insulating layer 14 corresponding to emitter region 13. Contact hole 15 has a shape corresponding to emitter region 13. Contact hole 16 is formed by photoetching at a position in first insulating layer 14 corresponding to base region 12. Contact hole 16 has a shape corresponding to base region 12. Emitter electrode 17 is filled in contact hole 15 and formed on first insulating layer 14 around contact hole 15. Base electrode 18 is filled in contact hole 16 and is formed on first insulating layer 14 around contact hole 16. Emitter and base electrodes 17 and 18 are formed interdigitally. Teeth 17-1 to 17-7 and teeth 18-1 to 18-8 are interdigitally formed at predetermined intervals. Emitter electrode 17 and base electrode 18 are formed such that a 1-$\mu$m thick aluminum film or an aluminum alloy film deposited on first insulating layer 14 is patterned by photoetching. Emitter electrode 17 filled in contact hole 15 is brought into ohmic contact with emitter region 13. Base electrode 18 filled in contact hole 16 is brought into ohmic contact with base region 12. 2-μm thick second insulating layer 19 is formed on emitter electrode 17, base electrode 16, and first insulating layer 14. Second insulating layer 19 comprises an insulating interlayer of $SiO_2$ or $Si_3N_4$ formed by plasma CVD. Contact holes 20-1 to 20-3 are formed at positions in second insulating layer 19 respectively corresponding to teeth 18-1 to 18-3 of base electrode 18. Contact holes 21-1 to 21-4 are formed at positions in second insulating layer 19 respectively corresponding to teeth 17-4 to 17-7 of emitter electrode 17. Base bonding pad 22 is formed on second insulating layer 19 and filled in contact holes 20-1 to 20-3. Emitter bonding pad 23 is formed on second insulating layer 19 and filled in contact holes 21-1 to 21-4. Bonding pads 22 and 23 are formed such that a 3-μm thick aluminum film or aluminum alloy film is deposited on the second insulating layer and is patterned by photoetching.

Members of base bonding pad 22 filled in contact holes 20-1 to 20-3 are respectively connected to base electrodes 16-1 to 16-3. Members of emitter bonding pad 23 filled in contact holes 21-1 to 21-4 are respectively connected to emitter electrodes 17-4 to 17-7. Passivation film 24 is formed on the resultant structure except for bonding portions 22A and 23A of bonding pads 22 and 23. Base deriving bonding wire 25 is formed on bonding portion 22A by thermocompression bonding. Emitter deriving bonding wire 26 is formed on bonding portion 23A by thermocompression bonding. Ball bonding (this method is also called as nailhead bonding) is performed for bonding bonding wires 25 and 26 by thermocompression bonding. Gold wires are used as bonding wires 25 and 26.

With the above structure, two metal columns are formed under bonding portion 22A. One metal column consists of aluminum of bonding pad 22 filled in contact hole 20-2 and aluminum of base electrode 18-2 filled in contact hole 16-2. The other metal column consists of aluminum of bonding pad 22 filled in contact hole 20-3 and aluminum of base electrode 18-3 filled in contact hole 16-3. These metal columns receive part of the pressure applied to bonding pad 22 during thermocompression bonding of bonding wire 25. Similarly, a metal column is also formed under bonding portion 23A. This metal column consists of aluminum of bonding pad 23 filled in contact hole 21-2 and aluminum of emitter electrode 17-5 filled in contact hole 15-5. The metal column receives part of the pressure acting on bonding pad 23 during thermocompression bonding of bonding wire 26. Therefore, the pressure acting on insulating interlayer 19 can be reduced, and formation of cracks in the step of insulating interlayer 19 can be prevented Portions where the metal columns are formed, i.e., the contact portion between bonding pad 22 and teeth 18-1 to 18-3 of base electrode 18 and the contact portion between bonding pad 23 and teeth 17-4 to 17-7 of emitter electrode 17 are preferably formed to cover the entire active region. Then, formation of cracks of insulating interlayer 19 can be suppressed with best efficiency. A wiring resistance from base region 12 to base deriving bonding wire 25 and a wiring resistance from emitter region 13 to emitter deriving bonding wire 26 can also be reduced. However, contact holes may be formed such that the metal columns are formed under only bonding portions 22A and 23A bonded to bonding wires 25 and 26.

The present inventor examined the frequency of occurrence of cracks of the insulating interlayer of the semiconductor device (FIGS. 1 and 2) of the present invention and that of the conventional semiconductor device. The materials and thicknesses of base and emitter electrodes, the material and thickness of the first insulating layer, and the material and thickness of the insulating interlayer were identical in the device of the present invention and the conventional device. As a result, the frequency of occurrence of cracks of the insulating interlayer in the conventional semiconductor device was 60% (12/20 devices), while that of the semiconductor device of the present invention was 15% (3/20 devices). As is apparent from this result, the frequency of occurrence of cracks of the insulating interlayer according to the present invention could be confirmed to be greatly reduced as compared with the conventional semiconductor device. When a defective (cracked) semiconductor device was examined with a microscopic picture, cracks in the insulating interlayer were concentrated on the corner portion of the emitter or base electrode pattern. Therefore, these cracks can be assumed to be formed by concentration of stress during bonding.

The above embodiment exemplifies an npn bipolar transistor. However, the present invention is not limited to this type of transistor. The present invention is applicable to a pnp bipolar transistor or any other semiconductor device. In the above embodiment, bonding pads 22 and 23 are formed on insulating interlayer 19. However, the present invention is further applicable to a multilayered wiring structure wherein an insulating interlayer is formed on the first wiring layer and the second wiring layer is formed on the insulating interlayer if the semiconductor device allows bonding of the second wiring layer.

What is claimed is:

1. A semiconductor device comprising:
   a semiconductor substrate having a major surface including a major surface region;
   an active region formed in said major surface region of said semiconductor substrate;
   a first insulating layer formed on said major surface of said semiconductor substrate;
   a first-tier contact hole formed at a position in said first insulating layer corresponding to said active region;
   a metal layer formed in said first-tier contact hole and a portion of said first insulating layer around said first-tier contact hole;
   a second insulating layer formed on said metal layer and said first insulating layer;
   a second-tier contact hole formed at a position in said second insulating layer corresponding to said metal layer and located above said first-tier contact hole;
   a bonding paid formed on a portion of said second insulating layer and filled in said second-tier contact hole; and
   a bonding wire connected to regions of said bonding pad located above said first-tier and second -tier contact holes.

2. A device according to claim 1, wherein said active region includes a first impurity region formed in said active region of said major surface region of said semiconductor substrate and having a conductivity type opposite to that of said semiconductor substrate and a second impurity region formed in a surface portion of said first impurity region and having the same conductivity type as that of said semiconductor substrate.

3. A device according to claim 2, wherein said first-tier contact hole is formed in a portion of said first insulating layer on said second impurity region, and said metal layer is filled in said first-tier contact hole and formed on said first insulating layer around said first-tier contact hole.

4. A device according to claim 2, wherein said first-tier contact hole is formed in a portion of said first insulating layer on said first impurity region, and said metal layer is filled in said first-tier contact hole and formed ion said first insulating layer around said first-tier contact hole.

5. A device according to claim 2, wherein said semiconductor substrate serves as a collector region, said first impurity region serves as a base region, and said second impurity region has a comb-like shape and serves as an emitter region.

6. A device according to claim 5, wherein said metal layer includes a comb-like emitter electrode and a comb-like base electrode, said comb-like emitter and base electrodes being arranged such that teeth of said emitter electrode and teeth of said base electrode are interdigitally arranged at predetermined intervals.

7. A device according to claim 1 wherein said bonding wire is bonded to said bonding pad by thermocompression bonding.

8. A semiconductor device comprising:
- a semiconductor region of a first conductivity type having a major surface portion;
- an impurity region formed in said major surface portion of said semiconductor region and having a second conductivity type;
- a first insulating layer formed on said semiconductor region;
- a first-tier contact hole formed at a position in said first insulating layer corresponding to said impurity region having the second conductivity type;
- a wiring layer filled in said first-tier contact hole and formed on said first insulating layer around said first-tier contact hole;
- a second insulating layer formed on said wiring layer and said first insulating layer;
- a second-tier contact hole formed at a position in said second insulating layer corresponding to said wiring layer;
- a bonding pad filled in said second-tier contact hole and formed on said second insulating layer; and
- a bonding wire connected to said bonding pad located above said first-tier and second-tier contact holes.

9. A device according to claim 8, wherein said wiring layer includes a comb-like emitter electrode and a comb-like base electrode, said comb-like emitter and base electrodes being arranged such that teeth of said emitter electrode and teeth of said base electrode are interdigitally arranged at predetermined intervals.

10. A device according to claim 8, wherein said bonding wire is bonded to said bonding pad by thermocompression bonding.

11. A semiconductor device comprising:
- a semiconductor substrate of a first conductivity type having a major surface portion;
- a first impurity region formed in said major surface portion of said semiconductor substrate and having a second conductivity type;
- a second impurity region formed in a surface portion of said first impurity region and having the first conductivity type;
- a first insulating layer formed on said semiconductor substrate;
- a first contact hole formed at a position in said first insulating layer corresponding to said second impurity region;
- a second contact hole formed at a position in said first insulating layer corresponding to said first impurity region;
- a comb-like first electrode filled in said first contact hole and formed on said first insulating layer around said first contact hole;
- a comb-like second electrode filled in said second contact hole and formed on said first insulating layer around said second contact hole;
- a second insulating layer formed on said first and second electrodes and said first insulating layer;
- a third contact hole formed at a position in said second insulating layer partially corresponding to said first electrode;
- a fourth contact hole formed at a position in said second insulating layer partially corresponding to said second electrode;
- a first bonding pad filled in said third contact hole and formed on a portion of said second insulating layer;
- a second bonding pad filled in said fourth contact hole and formed on a portion of said second insulating layer;
- a first bonding wire connected to said first bonding pad; and
- a second bonding wire connected to said second bonding pad.

12. A device according to claim 11, wherein said first electrode includes an emitter electrode.

13. A device according to claim 11, wherein said second electrode includes a base electrode.

14. A device according to claim 11, wherein said first and second bonding wires are respectively bonded to said first and second bonding pads by thermocompression bonding.

15. A semiconductor device comprising:
- a semiconductor substrate of a first conductivity type having a major surface portion;
- a first impurity region formed in said major surface portion of said semiconductor substrate and having a second conductivity type;
- a second impurity region formed in a surface portion of said first impurity region and having the first conductivity type;
- a first insulating layer formed on said semiconductor substrate;
- a first contact hole formed at a position in said first insulating layer corresponding to said second impurity region;
- a second contact hole formed at a position in said first insulating layer corresponding to said first impurity region;
- a first electrode filled in said first contact hole and formed on said first insulating layer around said first contact hole;
- a second electrode filled in said second contact hole and formed on said first insulating layer around said second contact hole;
- a second insulating layer formed on said first and second electrodes and said first insulating layer;

a third contact hole formed at a position in said second insulating layer partially corresponding to said first electrode;

a fourth contact hole formed at a position in said second insulating layer partially corresponding to said second electrode;

a first bonding pad filled in said third contact hole and formed on a portion of said second insulating layer;

a second bonding pad filled in said fourth contact hole and formed on a portion of said second insulating layer;

a first bonding wire connected to said first bonding pad; and a second bonding wire connected to said second bonding pad.

* * * * *